United States Patent
Sjöland et al.

(10) Patent No.: US 11,323,128 B2
(45) Date of Patent: May 3, 2022

(54) CALIBRATION TECHNIQUE FOR TIME-INTERLEAVED ANALOG-TO-DIGITAL CONVERTERS

(71) Applicant: Telefonaktiebolaget LM Ericsson (publ), Stockholm (SE)

(72) Inventors: Henrik Sjöland, Lund (SE); Mattias Palm, Bara (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/271,899

(22) PCT Filed: Aug. 31, 2018

(86) PCT No.: PCT/EP2018/073451
§ 371 (c)(1),
(2) Date: Feb. 26, 2021

(87) PCT Pub. No.: WO2020/043303
PCT Pub. Date: Mar. 5, 2020

(65) Prior Publication Data
US 2021/0194491 A1  Jun. 24, 2021

(51) Int. Cl.
H03M 1/10 (2006.01)
H03M 1/06 (2006.01)
H03M 1/12 (2006.01)

(52) U.S. Cl.
CPC ....... H03M 1/1023 (2013.01); H03M 1/0678 (2013.01); H03M 1/1215 (2013.01)

(58) Field of Classification Search
CPC . H03M 1/1023; H03M 1/0678; H03M 1/1215
(Continued)

(56) References Cited

U.S. PATENT DOCUMENTS

| 8,159,377 B2 * | 4/2012 | Goldman ............ H03M 1/0624 341/118 |
| 9,608,652 B2 | 3/2017 | Lee et al. |
| 2019/0173480 A1 * | 6/2019 | Ryu .................... H03M 1/0624 |

OTHER PUBLICATIONS

Benabes, Philippe, et al., "Mismatch calibration methods for high-speed time-interleaved ADCs", IEEE 12th International New Circuits and Systems Conference (NEWCAS), Jun. 2014, 1-5.
(Continued)

*Primary Examiner* — Khai M Nguyen
(74) *Attorney, Agent, or Firm* — Murphy, Bilak & Homiller, PLLC

(57) ABSTRACT

A reference analog-to-digital converter (ADC) samples an input signal in parallel with sub-converters of a time-interleaved ADC. For each sub converter and for each of a plurality of output samples from the sub-converter, a calibration circuit determines whether the output sample from the sub-converter indicates an input signal polarity opposite that indicated by the reference ADC. For each such instance, a DC-offset sample is calculated as a difference between the output sample from the sub-converter and a target zero-crossing value for the sub-converter output. For each sub-converter, a series of DC-offset samples is filtered, to produce an average zero-crossing error for each sub-converter. This filtering may comprise a simple average, for example, or a moving average, a decaying filter, etc. Finally, a zero-crossing correction is applied for each of one or more of the sub-converters, based on the respective average zero-crossing error.

26 Claims, 9 Drawing Sheets

(58) Field of Classification Search
USPC .................................................. 341/118, 155
See application file for complete search history.

(56) References Cited

OTHER PUBLICATIONS

Buchwald, A., "A Supposedly Clever Thing I'll Never Do Again", 2017 IEEE Custom Integrated Circuits Conference {CICC}, Austin, TX, 2017, 1-8.

Dortz, Nicholas Le, et al., "A 1.62GS/s Time-Interleaved SAR ADC with Digital Background Mismatch Calibration Achieving Interleaving Spurs Below 70dBFS", IEEE International Solid-State Circuits Conference, 2014, 1-3.

El-Chammas, Manar, et al., "A 12-GS/s 81-mW 5-bit time-interleaved flash ADC with background timing skew calibration", Stanford University, Stanford, CA 94305, USA, Jun. 2010, 1-2.

Lee, Sunghyuk, et al., "A 1 GS/s 10b 18.9 mW Time-Interleaved SAR ADC With Background Timing Skew Calibration", IEEE Journal of Solid-State Circuits, vol. 49, No. 12, Dec. 2014, 1-11.

Saleem, Shahzad, et al., "Adaptive Compensation of Frequency Response Mismatches in High-Resolution Time-Interleaved ADCs using a Low-Resolution ADC and a Time-Varying Filter", IEEE Xplore, Circuits and Systems (ISCAS), Signal Processing and Speech Communication Laboratory Graz University of Technology, Austria, 2010, 1-4.

Song, Jeonggoo, et al., "A 10-b 800MS/s Time-Interleaved SAR ADC withFast Timing-Skew Calibration", IEEE Journal of Sou D-State Circuits, IEEE Service Center, Piscataway, NJ, USA, vol. 52, No. 10, University of Texas at Austin, Austin, TX, USA, Oct. 2017, 1-4.

Stepanović, Dušan, et al., "A 2.8GS/S 44.6mW Time-Interleaved ADC Achieving 50.9dB SNDR and 3dB Effective Resolution Bandwidth of 1.5GHz in 65nm CMOS", IEEE Journal of Solid-State Circuits, IEEE Service Center, Piscataway, NJ, USA, vol. 48, No. 4, Berkeley Wireless Research Center, Department of Electrical Engineering and Computer Sciences, University of California, Berkeley, 2013, 1-2.

Wang, Xiao, et al., "A Novel Autocorrelation-Based Timing Mismatch Calibration Strategy in Time-Interleaved ADCs", IEEE International Symposium on Circuits and Systems (ISCAS), Institute of Microelectronics, May 2016, 1-4.

\* cited by examiner

*Fig. 1 – Prior Art*

CALIBRATION TECHNIQUE FOR TIME-INTERLEAVED ANALOG-TO-DIGITAL CONVERTERS

TECHNICAL FIELD

The present disclosure is generally related to time-interleaved analog-to-digital-converter (ADC) circuits and is more particularly related to automatic calibration techniques for such circuits.

BACKGROUND

There is a strong trend in wireless transceivers for 5G and other standards to use ever higher bandwidth, posing stringent requirements on the analog-to-digital converters (ADCs) used in their receivers. Time interleaving is a powerful technique for achieving high bandwidth with attractive power consumption. In this technique several lower speed sub-ADCs are used in parallel in a time-interleaved fashion, so that when N sub-ADCs are used, each sub-ADC only needs to process every Nth sample. The speed requirement of each sub-ADC is thus relaxed N times, compared to a single ADC providing the same sample rate.

FIG. 1 illustrates an example time-interleaved ADC (TI-ADC) circuit, comprising two sub-ADCs 110 operating in parallel. Each of these sub-ADCs is clocked at a fraction of the system clock frequency, i.e., ½ in this example where only two sub-ADCs are used. The clock distribution circuit provides the clocking signals to the sub-ADCS 110 so that the sub-ADCs 110 are sampled successively, at uniform time offsets from each other. The N-bit outputs of the sub-ADCs 110 are combined, in an interleaved fashion, by the 2:1 multiplexer.

Other aspects of the example TI-ADC circuit of FIG. 1 are similar to those in conventional ADC circuits, such as the track-and-hold (T/H) circuits and input amplifier. The sub-ADCs can have high resolutions, in some embodiments, e.g., 10 or more bits. While only two sub-ADCs are included in the example shown in FIG. 1, the same principles can be applied to create TI-ADC circuits with more sub-ADCs, e.g., four, eight, or sixteen sub-ADCs, to provide a higher output sample rate for the circuit as a whole or to reduce the sampling rate for each of the sub-ADCs, or both.

A drawback to the use of time-interleaved ADCs is that errors will occur due to mismatch between the N sub-ADCs. For instance, if the sub-ADCs have different DC-offsets, a fixed pattern noise will result in the sampled output. If they have different gains, a signal-dependent distortion will occur. Likewise, sampling time errors among the sub-ADCs will also produce signal-dependent distortion. Calibration techniques that can correct for these errors are therefore very important. Accordingly, FIG. 1 illustrates offset and gain error adjustments to each of the two sub-ADCs. Further, the initial T/H circuit shown in the example circuit of FIG. 1, which may be viewed as a "central," or "common" T/H circuit, can reduce the sampling time error problem, which could be considerably worse if the central T/H circuit is omitted, but which remain, to a reduced extent, even with it. It is desirable for the calibration to be fast and reliable, to pose minimum cost and power overhead, and to be performed in the background without introducing disturbances.

While a few different methods for self-calibration of a time-interleaved ADC exist today, there is still a need for improvements in many of these aspects. For instance, in one technique, statistics of the sampled output are monitored and circuit parameters are adjusted so that the statistics converge on expected results for those statistics, e.g., as described in B. Murmann and B. E. Boser, *Digitally Assisted Pipeline ADCs: Theory and Implementation*, Boston: Kluer Academic Publishers, 2004. However, this approach assumes that the statistics for the input signals are known and well-behaved—if this assumption is not correct, this approach may yield pattern-dependent errors. See M. El-Chammas and B. Murmann, *Background calibration of time-interleaved data converters*, 1st ed. New York: Springer, 2012.

In another approach to background calibration, which is not based on signal statistics, additional information from a reference ADC is used, where a high-resolution reference ADC is clocked at a lower speed than the sub-ADCs. The reference ADC can thereby be made both accurate and low power. If this same reference ADC is used in the calibration of all N sub-ADCs, relative mismatches in offset and gain should be eliminated. While this seems promising in theory, this type of technique is full of practical pitfalls, as documented in A. Buchwald, "A Supposedly Clever Thing I'll Never Do Again," 2017 *IEEE Custom Integrated Circuits Conference* (*CICC*), Austin, Tex., 2017, pp. 1-8.

Accordingly, further improvements in automatic calibration of time-interleaved ADCs are needed.

SUMMARY

Instead of using a low-speed, high-resolution, reference ADC for calibration, as has been previously proposed, the techniques described herein use a high-speed, low-resolution, reference ADC. The reference ADC is then able to operate on every signal sample, avoiding the problematic sub-sampling that causes disturbances in the previously described approach. Because it uses a very low resolution, the reference ADC power consumption can still be kept low. The techniques described herein can be carried out with just three comparators in the reference ADC, corresponding to 2-bit operation. With this approach, one comparator detects the polarity of the input signal, thereby detecting zero crossings. The output of this comparator is used to eliminate the offset mismatch. The other two comparators compare the input signal to a positive and negative value, respectively, with their outputs being used to eliminate gain mismatch. All three comparators can be used together to eliminate timing mismatch.

For example, in some embodiments, a method according to some of the techniques disclosed herein includes sampling the input signal at the TI-ADCs output sample rate, using a reference analog-to-digital converter (reference ADC) operating in parallel with the sub-converters. This example method further includes, for each sub-converter and for each of a plurality of output samples from the sub-converter, determining whether the output sample from the sub-converter indicates an input signal polarity, with respect to a reference level for the sub-converter output, opposite that indicated by the corresponding output from the reference ADC. For each instance where the output sample from the sub-converter indicates an input signal polarity that is opposite that indicated by the corresponding output from the reference ADC, a DC-offset sample is calculated based on a difference between the output sample from the sub-converter and the reference level. In some embodiments, for example, the DC-offset sample error may be calculated as proportional to the difference between the output sample from the sub-converter and the reference level. For each sub-converter, a series of DC-offset samples calculated as above is filtered, to produce a DC-offset estimate for each sub-converter. This filtering may comprise a simple average, for example, or a moving average, a decaying filter, etc. Finally, a DC-offset correction is applied for each of one or more of the sub-converters, based on the respective average DC-offset estimate.

In some embodiments, the steps summarized above may be followed by or accompanied by a gain calibration. Thus, for example, the method may further include, for each sub-converter and for each of a plurality of output samples from the sub-converter, evaluating the output sample from the sub-converter with respect to the corresponding output from the reference ADC. For each instance where the output sample from the sub-converter indicates an input signal magnitude greater than the magnitude of a non-zero reference value when the corresponding output from the reference ADC indicates an input signal magnitude less than the magnitude of the non-zero reference value, a positive-valued sample gain error is calculated, based on a difference between the output sample from the sub-converter and an expected output sample value for the non-zero reference value. Likewise, for each instance where the output sample from the sub-converter indicates an input signal magnitude less than a non-zero reference value magnitude when the corresponding output from the reference ADC indicates an input signal magnitude greater than the non-zero reference value magnitude, a negative-valued sample gain error is calculated, based on a difference between an expected output sample value for the non-zero reference value and the output sample from the sub-converter. Methods according to these embodiments further include filtering a series of sample gain errors as calculated above, for each sub-converter, to produce an average gain error for the respective sub-converter. A gain correction is then applied for each of one or more of the sub-converters, based on the respective average gain error.

The DC-offset and/or gain calibration techniques summarized above may be followed by and or accompanied by a timing offset calibration process, in some embodiments. Thus, for example, the example methods summarized above may further include, for each sub-converter and for each of a plurality of output samples from the sub-converter, estimating a derivative of the input signal at a point corresponding to the output sample, using neighboring output samples from sub-converters sampling before and after the sub-converter. These embodiments further include calculating sample timing errors for the sub-converter based on the estimated derivative and the DC-offset sample for the sub-converter and output sample. In some embodiments, only the sign of the derivative of the input signal is estimated, and the estimated sign of the derivative is multiplied by the DC-offset sample for the sub-converter and output sample. The methods according to these embodiments further include, for each sub-converter, filtering a series of sample timing errors, to produce an average timing error for each sub-converter. A timing correction is then applied to each of one or more of the sub-converters, based on the respective average timing error.

Example self-calibrating analog-to-digital converter (ADC) circuits corresponding to the methods summarized above are also described in detail below. An example circuit according to some embodiments includes a time-interleaving analog-to-digital converter (TI-ADC) having a plurality of multi-bit sub-converters, each of the plurality of sub-converters being configured to sample an input signal at a sub-converter sampling rate that is a fraction of an output sample rate of the TI-ADC. The circuit further includes a reference analog-to-digital converter (reference ADC) configured to sample the input signal in parallel with the sub-converters, at the TI-ADC's output sample rate, and a calibration circuit configured to receive the output of the reference ADC and output samples from each of the sub-converters. The calibration circuit is configured to carry out one or more of the calibration processes summarized above, in various embodiments. Thus, for example, in some embodiments the calibration circuit is configured to, for each sub-converter and for each of a plurality of output samples from the sub-converter, determine whether the output sample from the sub-converter indicates an input signal polarity, with respect to a reference level for the sub-converter, opposite that indicated by the corresponding output from the reference ADC and, for each instance where the output sample from the sub-converter indicates that the input signal polarity is opposite that indicated by the corresponding output from the reference ADC, calculate a DC-offset sample as a difference between the output sample from the sub-converter and a target zero-crossing value for the sub-converter output. The calibration circuit is further configured to filter a series of DC-offset samples for each sub-converter, to produce a DC-offset estimate for each sub-converter, and to apply a zero-crossing correction for each of one or more of the sub-converters, based on the respective DC-offset estimate.

Other embodiments of the example self-calibrating ADC circuit summarized above are described in detail below.

Using the techniques described herein, a minimal amount of additional hardware can be used to provide the required information for calibration of all major error sources in time-interleaved ADCs. Only three comparators are needed, in some embodiments. Sub-sampling is not used for the reference ADC, eliminating a very difficult source of disturbances. Simple calculations in the digital domain are used to perform the calibration, i.e., comparisons, additions, and averaging. The calibration process can run in the background and can operate on regular input signals in the system, regardless of their spectral contents.

DETAILED DESCRIPTION

Figure 1:
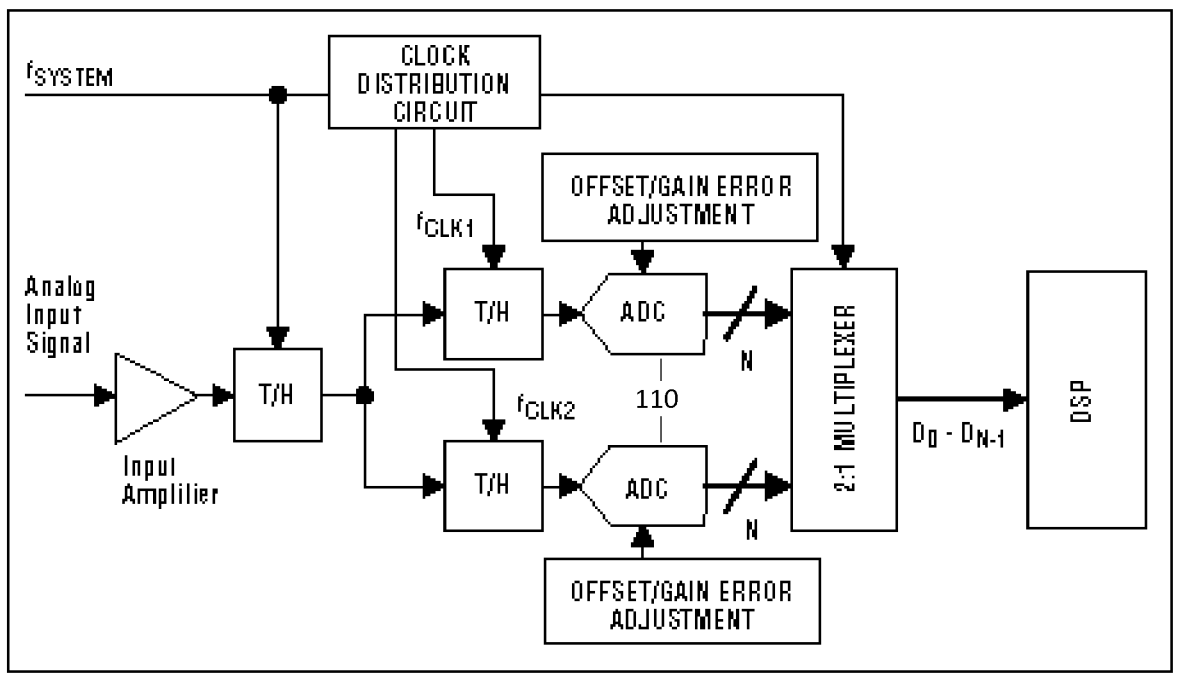
FIG. 1 illustrates an example time-interleaved ADC.

As noted above, instead of using a low-speed, high-resolution, reference ADC for calibration, as has been previously proposed, the techniques described herein use a high-speed, low-resolution, reference ADC. The reference ADC is then able to operate on every signal sample, avoiding the problematic sub-sampling that causes disturbances in the previously described approach. Because it uses a very low resolution, the reference ADC power consumption can still be kept low. The techniques described herein can be carried out with just three comparators in the reference ADC, corresponding to 2-bit operation. With this approach, one comparator detects the polarity of the input signal, thereby detecting zero crossings. The output of this comparator can be used to eliminate the offset mismatch, as described in detail below. The other two comparators compare the input signal to a positive and negative value, respectively, with their outputs being used to eliminate gain mismatch. All three comparators can be used to eliminate timing mismatch.

First, an example of offset elimination according to the techniques described herein can be summarized as follows. At each sample, the reference ADC comparator detects the polarity of the input signal, with respect to a reference level, which may be zero, in some embodiments. This is then compared to the polarity of the output of a sub-ADC, with respect to a reference level for the sub-converter. If the two signals have the same polarity, no error is detected, and no action is taken. If the polarity is different, an error signal is created, which is equal to the difference between the sub-ADC's output signal and the reference level. For instance, if the reference ADC shows that the signal should be negative, with respect to the reference level, but the sub-ADC outputs a value of three least significant bits (LSBs) above the reference level for the sub-converter, the error is +3. Similarly, if the reference ADC shows positive polarity, but the sub-ADC indicates negative polarity with a value of 2 LSBs below the reference level, the error is −2.

The average of the errors for that sub-ADC is taken over time, e.g., as a rolling average, and the sub-ADC is adjusted to drive that error to zero. This adjustment can be made by an addition in the digital domain, e.g., by adding or subtracting a compensating offset to the output of the sub-ADC, or by an equivalent adjustment in the analog domain. This technique is applied independently to each of the sub-ADCs in the time-interleaved ADC.

A similar approach may be taken for the gain error, using two comparators that compare the input signal to two levels of equal magnitude but opposite polarity. Note that both the zero crossing and the equal levels with opposite polarity lend themselves very well to accurate differential circuit implementation. The comparators' outputs are compared to the output of a sub-ADC, and the error, including the polarity of the error, is evaluated for each comparator. The averaged error is then calculated, in which the errors for the negative comparator are sign reversed whereas the errors from the positive comparator are not, resulting in a gain error measure. The gain is then adjusted in proportion to this error, which will cause the system to strive towards a gain error of zero. It should be noted that all sub-ADCs are calibrated against the same reference, making them substantially equal, which will eliminate errors due to time interleaving, even if the reference ADC has its own gain error. It should also be noted that the error signals of the two comparators, when both are taken with positive polarity (i.e., without sign reversal when calculating the average value), can be used to complement the error signal obtained from the zero-crossing comparator in the detection of zero-crossing error (DC-offset).

Timing offsets among the sub-ADCs produce errors that are proportional to the sampled signal's derivative. Providing an error estimation with correct polarity therefore requires estimating at least the sign of the signal's derivative. (As discussed below, the magnitude of the signal's derivative may also be used, in some embodiments.) Output signals from a preceding and a succeeding sub-ADC are used to estimate the sign of the derivative by comparing the two sub-ADC levels. Any of the three comparators of the reference ADC can be used for producing an error signal, by comparing the output of the comparator to the output of the sub-ADC under evaluation. This error signal is then multiplied by the sign of the signal derivative, in some example implementations. An average of this resulting value is then used to adjust the timing of the sampling. This timing adjustment can be performed in the analog or digital domain, but the analog approach is most straight-forward.

An alternative approach for calibrating timing errors is to first calibrate offset and gain errors, after which some errors will still be detected from all three comparators, although with a zero average. Alternatively, just the offset is calibrated, and only the comparator at the zero-crossing is then used, which will produce an error with a zero average. The remaining errors detected will be caused by timing errors. By monitoring the average of the absolute errors, i.e., sign-reversing negative-valued errors before averaging, a measure of the timing errors will result. By adjusting the sampling instant for the sub-ADC until this measure is minimized, e.g., by trial and error, the timing error can be calibrated away. With this approach it is not necessary to estimate the derivative of the signal for each error sample. On the other hand, the lack of sign of the error complicates the search algorithm. Again, the timing adjustment can be performed in the analog or digital domain, but the analog approach is most straight-forward. While the offset and gain calibrations can be performed simultaneously without restriction, waiting until these have settled before starting this alternative time calibration will improve the convergence.

As noted above, the techniques herein use a single low-resolution high-speed reference ADC to calibrate a time-interleaved higher-resolution ADC. By using a low resolution, such as two bits, in the reference ADC, its power consumption can be made low compared to the ADC to be calibrated, limiting the power overhead. The area will also be very small, with just 3 comparators.

Figure 2:
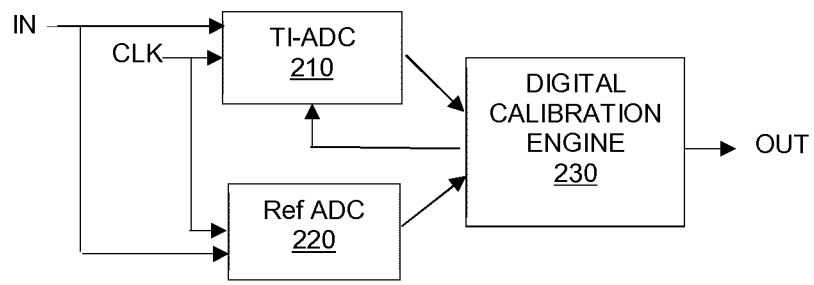
FIG. 2 illustrates a time-interleaved ADC with reference ADC for calibration, according to some embodiments disclosed herein.

An overview of an example self-calibrating ADC circuit according to some embodiments of the present invention is shown in FIG. 2. This system includes a time-interleaved ADC (TI-ADC) 210, which in turn comprises multiple sub-ADCs operating in parallel on the same input signal ("IN"), e.g., as shown in the example time-interleaved ADC shown in FIG. 1. These sub-ADCs are typically high-resolution ADCs, e.g., with outputs of 10 bits or more.

The clock signal ("CLK") shown in FIG. 2 is the high-speed clock, governing the overall sampling rate of the TI-ADC; each of the sub-ADCs in the TI-ADC is clocked with a divided-down version of the clock signal, so that each of the sub-ADCs is operating at a fraction (e.g., ¼ or ⅛) of the TI-ADCs output sampling rate. Aside from the timing offset errors described herein, each sub-ADC samples the input signal at a uniform time offset from its neighbors.

The system in FIG. 2 further includes a reference ADC 220, which operates on the same input signal ("IN") applied to the TI-ADC. In contrast to the high-resolution sub-ADCs in the TI-ADC, the reference ADC is a low-resolution device, e.g., having a two-bit output derived from just three comparators. However, again unlike the high-resolution sub-ADCs in the TI-ADC, the reference ADC operates at the full clock speed, i.e., and thus samples the input signal at the TI-ADC's output sample rate, rather than at the lower sampling rate used by the sub-ADCs.

Finally, the system in FIG. 2 includes a digital calibration engine 230, comprising digital logic and, in some cases, analog circuitry, configured to generate and apply correction signals to the sub-ADCs in the TI-ADC. The digital calibration engine 230 evaluates the errors by comparing the signals from the reference ADC and each of the sub-ADCs, as described in further detail below. The digital calibration engine 230 maintains calibration for each sub-ADC separately; consequently, it can apply corrections either in the digital domain, by directly adjusting the TI-ADC's digital outputs corresponding to any given sub-ADC, or in the analog domain, by feeding back correction signals to the respective sub-ADCs.

The reference ADC 220, which operates at the full clock speed of the TI-ADC, may consist of only three comparators, in some embodiments, although nothing prevents the use of additional comparators. However, keeping the reference ADC 220 design simpler makes it easier to implement the reference ADC 220 with high precision. It is also possible to use just two comparators, which is the minimum number required to calibrate gain errors, although using three comparators is preferable in terms of performance. If gain calibration is sacrificed, and just offset and timing is to be calibrated, it is even possible to use a single comparator.

Figure 3:
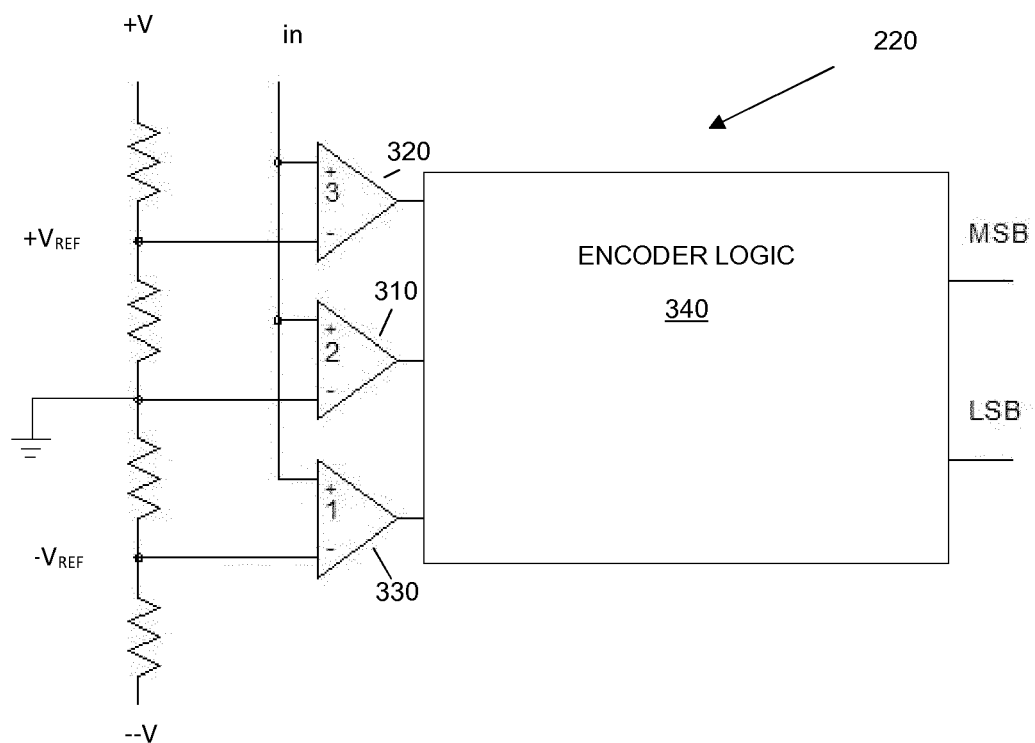
FIG. 3 illustrates an example two-bit ADC, which may be used as a reference ADC in various embodiments.

FIG. 3 illustrates an example configuration for reference ADC 220, comprising a zero-level comparator 310, a positive-level comparator 320, a negative-level comparator 330. The positive-level and negative-level comparators 320 are designed with reference voltages +Vref and −Vref, i.e., with the same absolute values but opposite polarity. Thus, the zero-level comparator 310 provides a positive output, or a "1," if the input voltage is higher than zero, while providing a negative output, or a "0," if the input voltage is less than zero. The positive-level comparator 320 and negative-level comparator 330 operate in the same way, but with respect to their respective reference voltages +Vref and −Vref. The reference ADC 220 in FIG. 2 further includes encoder logic 340, to convert the three comparator outputs into two bits, an MSB and an LSB. However, it will be appreciated in view of the detailed discussion that follows that embodiments of the present invention may work directly from the comparator outputs, and that this digital logic need not be present in all embodiments.

Figure 4:
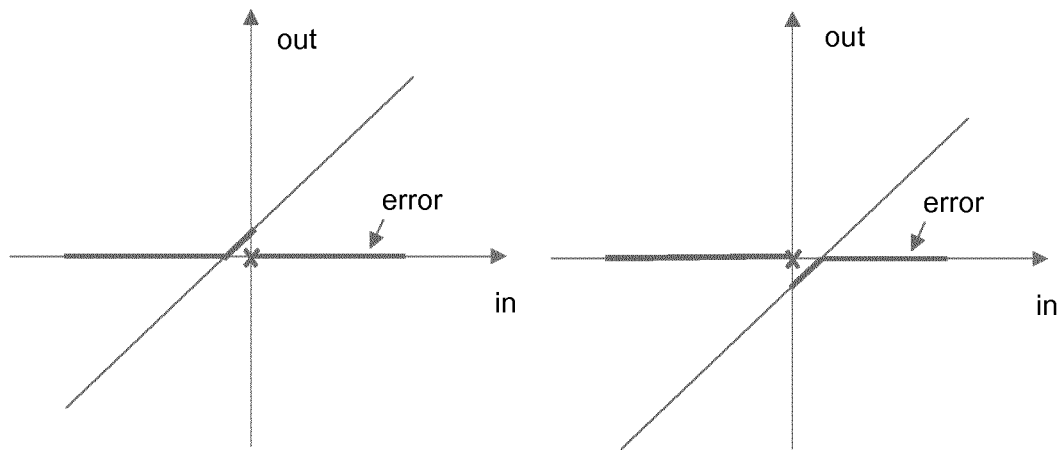
FIG. 4 illustrates DC-offset error for a sub-ADC.

Discussed first are details of the DC-offset calibration, where the goal is that all sub-ADCs in the TI-ADC have the same DC-offset, to avoid static patterns from forming in the output signal. An error for a given sub-ADC will be detected when the reference ADC's sample and the output of the corresponding sub-ADC indicate different signal polarities. This is illustrated in FIG. 4, which illustrates sub-ADC transfer functions for sub-ADCs having two different polarity offsets. The transfer function (the upwards-slanting straight line) shown on the left side does not cross the origin, but instead has a positive DC offset. The transfer function shown on the right side of FIG. 4 also misses the origin, but instead has a negative DC offset. The bolded line in each half of the figure is non-zero in the region in which an error in polarity can be detected, i.e., where the output signal of the sub-ADC has a different polarity than would be expected if there were no DC offset. As can be seen, an error in the polarity can be detected for signals close to the zero crossing, by simply comparing the sub-ADC's output to the output of the zero-level comparator 310 of the reference ADC 220. Note that these comparisons are carried out and their results accumulated separately, for each sub-ADC. Thus, when the calibration is taking place, there is a comparison result for each sample output by each sub-ADC.

For a sub-ADC with a positive DC offset, for example, a comparison of the sub-ADC's sampled output with the reference ADC's zero-level output will indicate a positive error for values close to zero, corresponding to the region in the left-hand part of FIG. 4 where the output of the sub-ADC is greater than zero even though the input signal is less than zero. For this region, a comparison of the sub-ADC's output to the output of the zero-level comparator 310 of the reference ADC 220 will indicate a positive error. Likewise, for a sub-ADC with a negative DC offset, a comparison of the sub-ADC's sampled output with the reference ADC's zero-level output will indicate a negative error for values close to zero, corresponding to the region in the right-hand part of FIG. 4 where the output of the sub-ADC is less than zero even though the input signal is greater than zero. By averaging these non-zero errors, an estimation of the offset error can thus be found. Note that it is only when the input signal is close to the zero crossing that an error is found—larger positive or negative values of the input signal contribute nothing to the averaged error.

For a 10-bit TI-ADC to be calibrated to single least-significant bit (LSB) accuracy, the digital calibration engine should process a number of sub-ADC samples on the order of $10*2^{10}$. This is the number of samples required for a sufficient number of samples within 1 LSB of the zero crossing to occur. With each sub-ADC operating at 1 GS/s, for example, this will take about 10 uS, when only a single comparator, e.g., a zero-crossing comparator, is used. If necessary, this could be sped up by using also the information from the two other comparators when performing the offset calibration, which can detect the DC offset error when the input signal is close to the reference value of the positive-level and negative-level comparators 320 and 330. Having equal magnitudes, these will produce an average output signal that is sensitive only to the DC offset of the sub-ADC (relative to the reference ADC). With three regions of non-zero error instead of just one, the calibration time may be reduced about three times.

Figure 5:
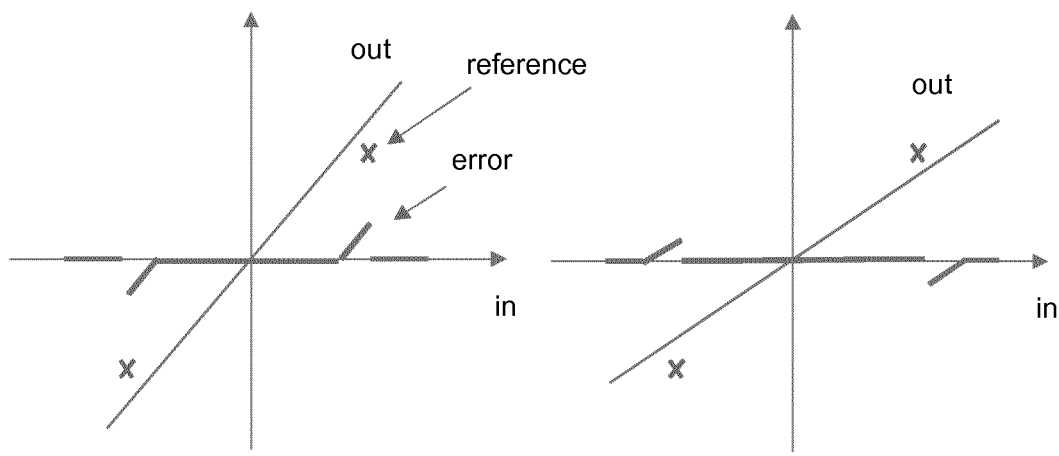
FIG. 5 shows gain error for a sub-ADC.

Next, gain calibration may be considered. This follows a similar procedure, but involves a comparison to each of two values, of opposite polarity. FIG. 5 illustrates the characteristics of gain error signals for the case of a gain that is too large (left side of FIG. 5) and a gain that is too low (right side of FIG. 5). Starting with the left side of FIG. 5, the transfer function for the sub-ADC at issue has a slope that is too steep, corresponding to a gain that is too high. As a result, the output of the sub-ADC is too high, at the positive reference voltage (+Vref) and too low (in absolute terms) at the negative reference voltage (−Vref). (The reference points, input voltage and output code, are illustrated with an "x" in the figures.) The situation is the opposite on the right-hand side of FIG. 5—there, the transfer function for the sub-ADC at issue has a slope that is not steep enough, corresponding to a gain that is too low, resulting in an output of the sub-ADC that is too low, at the positive reference voltage (+Vref) and too high (in absolute terms) at the negative reference voltage (−Vref).

As was the case with the previous figure, the bolded line in each half of FIG. 5 is non-zero in the region in which an error in polarity can be detected, i.e., where the output signal of the sub-ADC has a different polarity, with respect to the reference level, than would be expected if there was no gain miscalibration offset. As can be seen, an error in the polarity can be detected for signals close to the positive and negative reference voltages, by simply comparing the sub-ADC's output to the outputs of the positive-level comparator 320 and the negative-level comparator 330 of the reference ADC 220. Note that the left-side error signal (corresponding to the negative reference voltage) should be sign-reversed before averaging along with the right-side error signals, to obtain a gain error measurement that takes into account misalignment to both the positive and negative reference levels. When the DC-offset converges to zero, this positive and negative reference level misalignment corresponds to a gain error for the sub-ADC at issue. Note that the gain error evaluated in this way is largely independent of DC-offset, since a DC-offset results in equal polarity of the errors at the positive and negative reference levels, which thus cancel after sign reversal and addition. In a similar way, the evaluation of DC-offset is largely independent of gain errors, as a gain error results in opposite sign errors for positive and negative signal levels, which cancel when added. Also note that the detected gain error can be corrected in the analog domain, e.g., by directly adjusting an analog gain on the input side of the respective sub-ADC, or in the digital domain, e.g., by scaling the digital output of the respective sub-ADC.

For the gain calibration technique described above, the selection of reference levels involves a trade-off between speed and accuracy. If the magnitude of the reference levels is chosen to be relatively high, the influence of errors in the sub-ADCs on the gain estimate is minimized. On the other hand, the probability that the input signal reaches these larger magnitudes at any given time is lower, which means that the impact of the gain error will be observed less frequently and that the convergence time will be relatively longer. This tradeoff may be mitigated by using an approach where the reference value changes over time, e.g., using an algorithm where the magnitude is first relatively small, allowing rapid convergence, and then increases as the calibration continues, providing for increased accuracy.

Calibration to correct for timing offsets among the sub-ADCs according to a first technique follows an approach that differs significantly from the DC-offset and gain calibration procedures discussed above, in that the calibration routine for a given sub-ADC must take into account the outputs from multiple sub-ADCs at a time. In contrast, the DC-offset and gain calibration routines are performed separately, for each sub-ADC. This is because the timing offsets among the sub-ADCs produce errors that are proportional to the derivative of the input signal. Providing an error estimation with correct polarity therefore includes estimating the sign of this signal derivative, i.e., determining whether the input signal is rising or falling at the sample time for the sub-ADC whose timing is being calibrated. The outputs from a preceding and a succeeding sub-ADC are thus used to estimate the sign of the derivative, by comparing the outputs of these two adjacent sub-ADCs. It should be apparent that if the later-in-time sub-ADC has a lower output than the earlier-in-time sub-ADC, the input signal is falling, and the sign of the input signal's derivative is negative. The opposite is true if the later-in-time sub-ADC has a higher output than the earlier-in-time sub-ADC.

For producing the error signal, the output from any of the three comparators in the reference ADC 220 can be compared to the output of the sub-ADC under calibration, with the error detected by this comparison being multiplied by the sign of the signal derivative, in some embodiments. For example, a sample timing error for a given sub-converter can be obtained by multiplying the estimated sign of the derivative by the DC-offset sample for the sub-converter and output sample, where the DC-offset sample is obtained as described above for the DC-offset calibration. Alternatively, or additionally, the non-zero reference level comparisons can be used. In case the sub-converter output sample is above the reference value and the reference ADC sample is below, a positive error results. In case the sub-converter output sample is below the reference value and the reference ADC sample exceeds it, a negative error instead results. This resembles the calculation of gain error, except that the magnitude of the error is not sign reversed for the negative level comparison. The average of the product of DC-offset sample and sign of derivative, over time, is then used to adjust the timing of the sampling. It is also possible to use the magnitude of the derivative in the computation of the error signal, by performing a division of the error by the magnitude before averaging. If this approach is used, a lower limitation should be set on the magnitude before division to avoid large results that could upset the average. Using only the sign of the derivative in the calculation is simpler, however, and still yields good results.

As was the case with adjustments to DC-offset and gain, adjustments to correct for timing errors can be performed in the analog or digital domains. However, correcting for timing errors in the analog domain, e.g., by directly adjusting the sampling instant for the sub-ADC under calibration, is more straight-forward, as adjustments in the digital domain (by adjusting the ADC output) are dependent on accurate estimates of the instantaneous slope of the input signal at the adjusted sub-ADC.

An alternative approach for calibrating timing errors is to first calibrate offset and gain errors, using the techniques described above, after which some errors will still be detected from all three comparators, although with a zero average. Alternatively, just the offset is calibrated, and only the comparator at the zero-crossing is used, which will then produce an error with a zero average. The errors detected will be caused by timing errors. By monitoring the average of the absolute errors for a given sub-ADC, i.e., by averaging the errors after sign-reversing negative valued errors, a measure of the timing error will result for the sub-ADC, although without any indication of the direction of the timing offset error. By adjusting the sub-ADC's sampling instant until this measure is minimized, e.g., using a simple trial-and-error approach, the timing error can be calibrated away. With this technique, there is no need to estimate the derivative. On the other hand, the lack of sign of the error complicates the correction algorithm. As discussed above, the timing adjustments can be performed in the analog or digital domain, but the analog is most straight-forward. While the offset and gain calibrations described above can be performed simultaneously without restriction, it is best to wait until these have settled before beginning this alternative time calibration routine.

The calibration techniques described above have been simulated in Matlab, for a TI-ADC having 4 sub-ADCs and one reference ADC. The sampling frequency chosen for the simulation is 16 GHz, the full-scale for the simulated ADC range is ±1, and the thresholds for the two reference points are chosen to be vth2=−vth1=0.25. The reference ADC runs at the full speed, 16 GHz, and the sub-ADCs are sampled at a quarter of that rate, i.e., at 4 GHz. Each sub-ADC is calibrated based on samples from the reference ADC that correspond to those samples for the selected sub-ADC, i.e., the reference ADC is subsampled for each sub-ADC calibration procedure. Each simulation run is denoted an iteration and contains N=$2^{16}$ samples from the TI-ADC ($2^{16}$/4 samples per sub-ADC). The input signal is a sine wave, which is identical in each iteration. A high input frequency was chosen to also excite timing errors, as timing errors would not be visible for a low frequency input signal.

For the DC-offset calibration, when the reference ADC and the sub-ADC under calibration indicate different polarities, the error signal is formed by taking the value of the sub-ADC for sample k:

error($k$)=subadc($k$)(zero crossing).

For the gain calibration, when the reference ADC and sub-ADC indicate different polarities with respect to either of the two thresholds, the error signal is calculated. The error signal is formed by taking the value of the sub-ADC for sample k and subtracting the respective threshold:

error($k$)=subadc($k$)−$v$th1 (positive values); and error($k$)=−(subadc($k$)−$v$th2)(negative values)

Notice that the error signal for negative values must be sign reversed for correct polarity and to avoid that positive and negative errors cancel out when the average gain error is calculated.

For timing error calibration, timing errors may be found using all three reference points (zero, vth1 and vth2), or only the zero crossing. In both cases, the timing error signals are multiplied by the sign of the derivative. The derivative is found by subtracting the values of the sample before and after the current TI-ADC sample, using the two corresponding sub-ADC samples:

diff($n$)=subadc($n$+1)−subadc($n$−1).

The sign is then computed as:

sign=1,diff≥0.

sign=−1,diff<0.

Alternatively, the sign can be set to zero when diff is equal to zero.

The error signal is constructed when the reference ADC and sub-ADC indicate different polarities with respect to the zero crossing, vth1 and vth2 with:

error($k$)=sign*subadc($k$)(zero crossing);

error($k$)=sign*(subadc($k$)−$v$th1)(positive values); and error($k$)=sign*(subadc($k$)−$v$th2)(negative values).

Note that here, in contrast with the gain calibration routine, the negative values are not sign-reversed when incorporated into the error signal computation.

Figure 6:
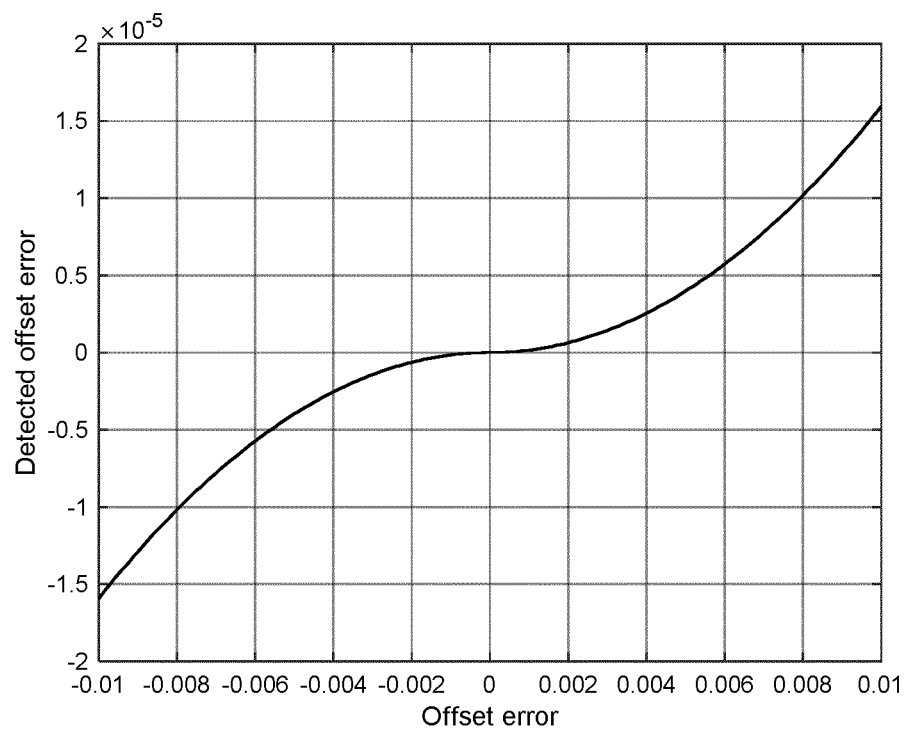
FIG. 6, FIG. 7, and FIG. 8 illustrate simulation results, showing detected offset error, detected gain error, and detected timing error respectively.
Figure 7:
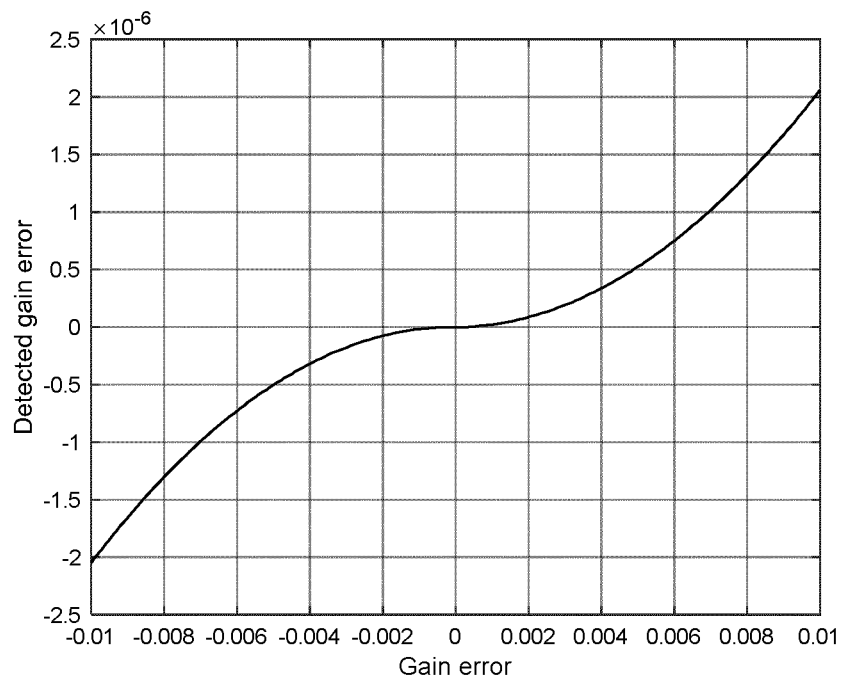
Figure 8:
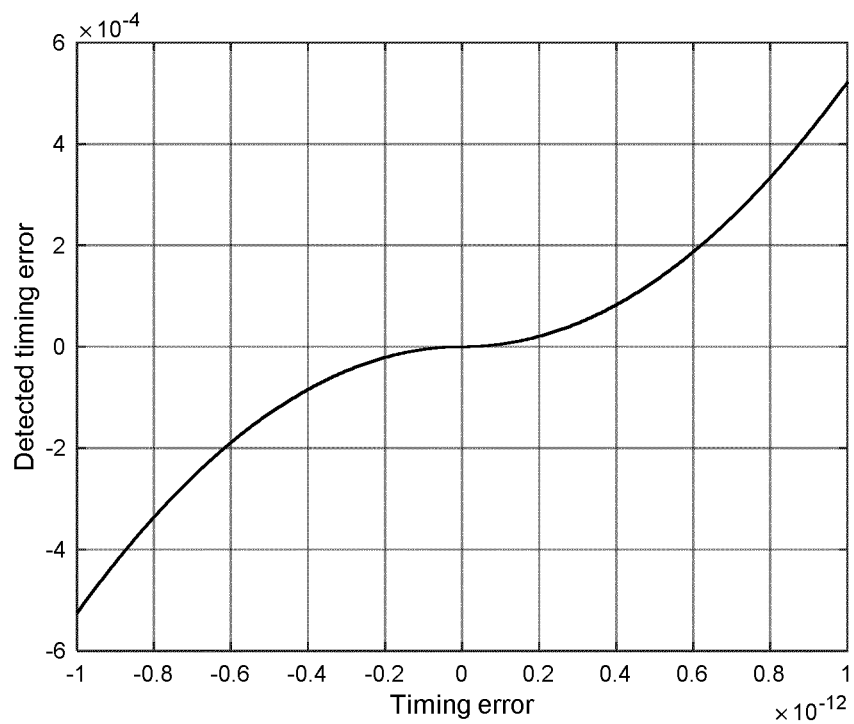

Input-output characteristics for errors in offset, gain, and timing are shown in FIGS. 6, 7, and 8, respectively. For each iteration, the average error is calculated based on the samples taken. Note that in this case both the zero and non-zero error samples are included in the average, resulting in a parabolic shape of each side of the characteristic, as increasing the error proportionally increases both the number of non-zero samples, and the magnitude of these. In case a linear response is desired, the zero valued samples could be removed from the average, or all non-zero samples could use the same magnitude, e.g., +/−1, while keeping the zero valued samples, then essentially detecting the magnitude of the error using the frequency of non-zero sample errors.

Alternatively, an inverse non-linearity, essentially a square root function, can be used, with pre and post sign reversal for negative values. For a small error, it is possible that none of the samples detect an error, causing the average error to zero. This causes a deadband behavior that will limit the resolution in the error detection. The deadbands in the simulations are approximately +/−0.1e-3, +/−0.4e-3, and <5 femtoseconds for FIGS. 6, 7, and 8, respectively. The deadband is most troublesome for the gain error detection, and will typically limit the performance in the simulations of the TI-ADC. The deadband for the timing error is very small, and further simulations have shown that $2^{14}$ samples is sufficient to calibrate down to 10-femtoseconds timing error.

Figure 9:
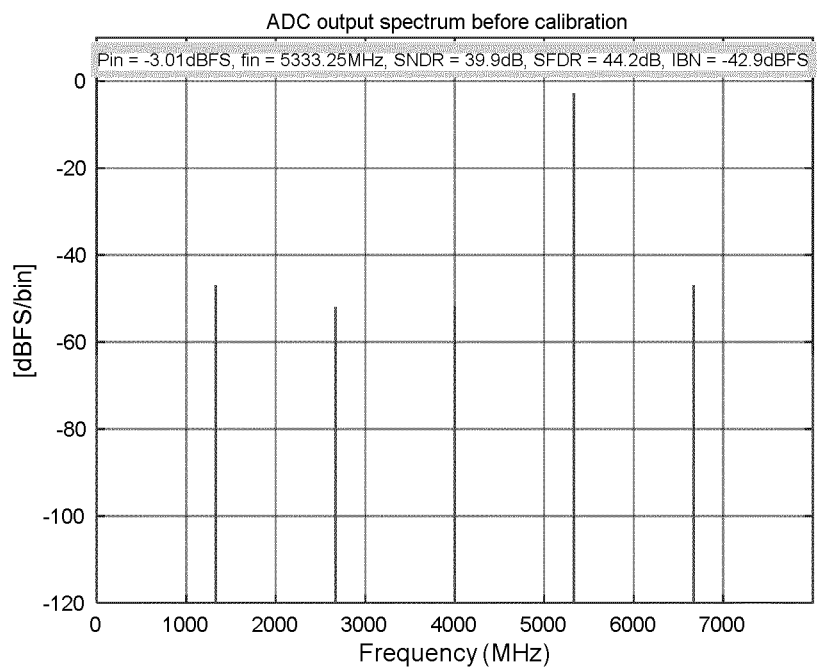
FIG. 9 shows a simulated TI-ADC output spectrum before calibration.
Figure 13:
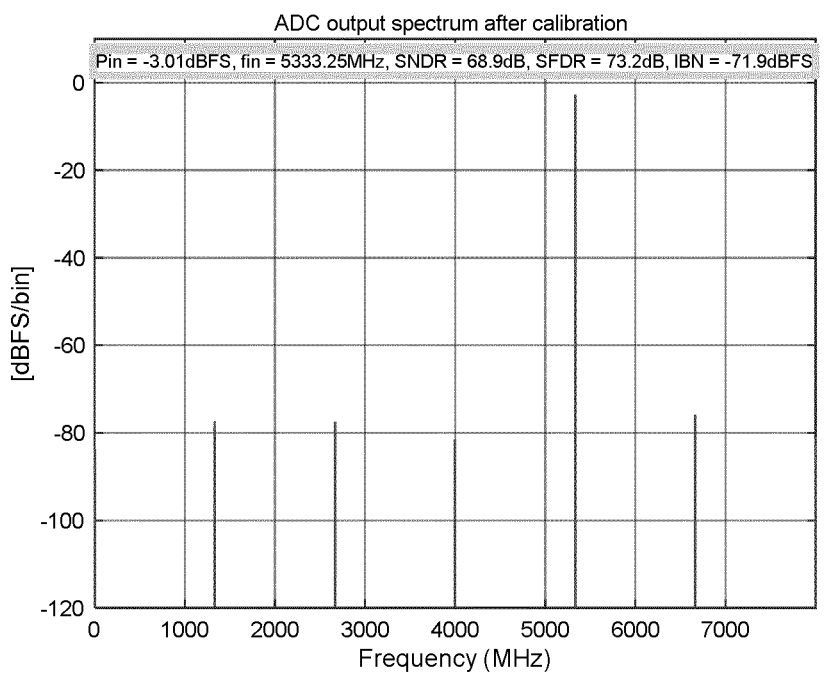
FIG. 13 illustrates a simulated TI-ADC output spectrum after calibration according to a first timing calibration technique.

The TI-ADC performance is simulated before and after calibration—see FIG. 9 and FIG. 13, which show the ADC output spectrum before and after calibration. Note that the calibration order chosen for this simulation is timing, gain, and finally offset.

Figure 10:
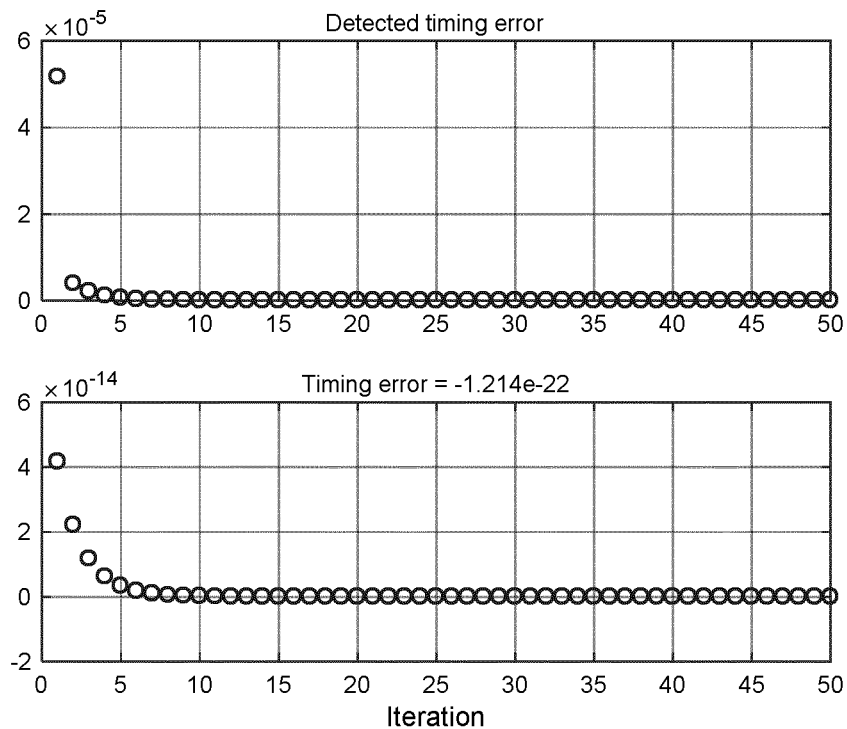
FIG. 10, FIG. 11, and FIG. 12 illustrate simulation results as a function of time, for detected timing error, detected gain error, and detected offset error, respectively.
Figure 11:
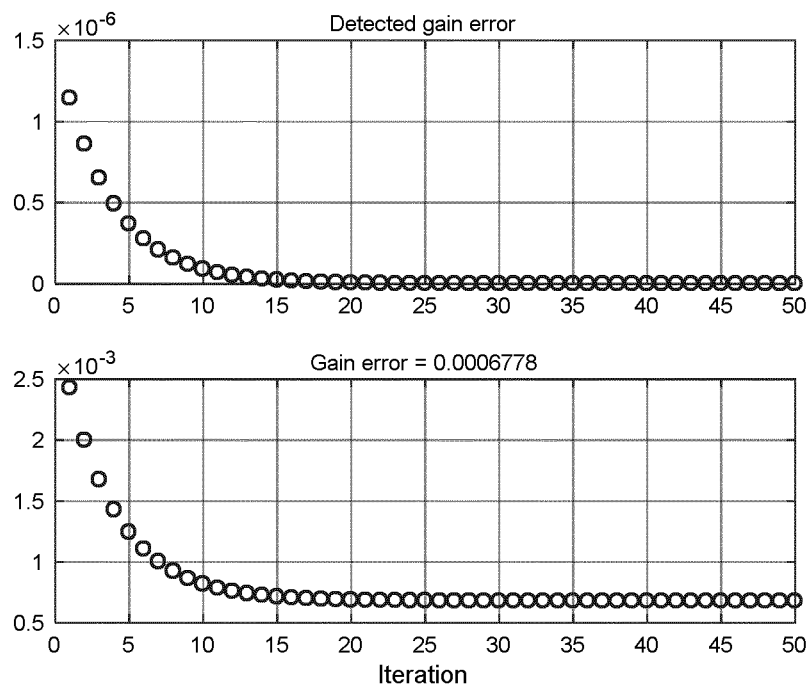
Figure 12:
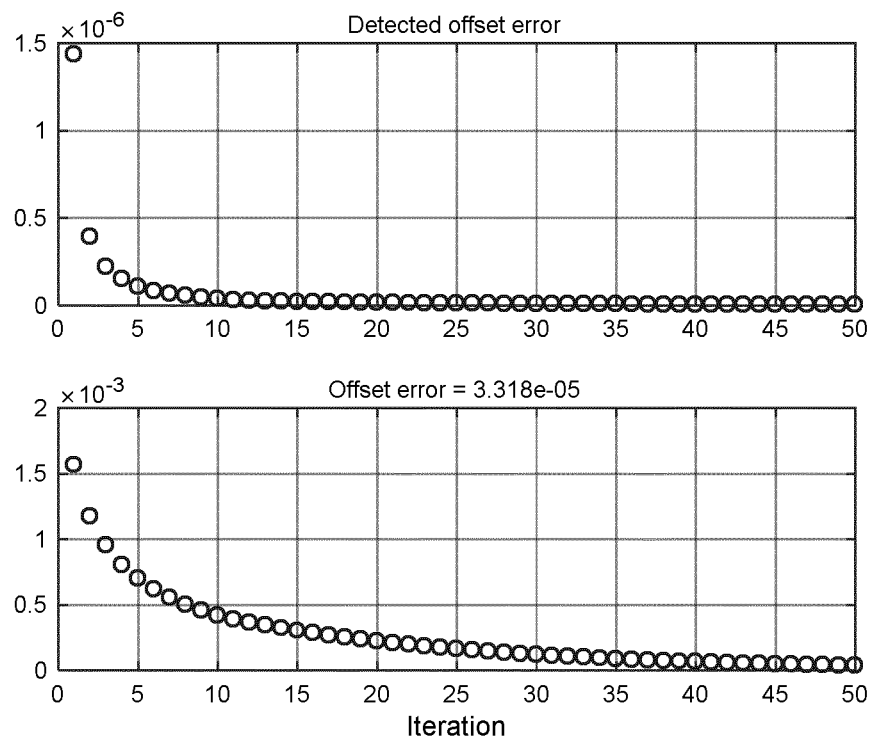

The three error sources over time (iteration) are shown for subADC #4 in FIG. 10, FIG. 11, and FIG. 12. For each iteration, the average detected error (avg_err) is calculated from all samples. The corresponding error source (err) is then driven towards zero by subtracting the detected error scaled by a gain:

err=err−gain*avg_err, where the gain is chosen with a tradeoff between settling speed and stability. The above control system is meant as an example—a more elaborate system could be built with different settling behavior.

Figure 14:
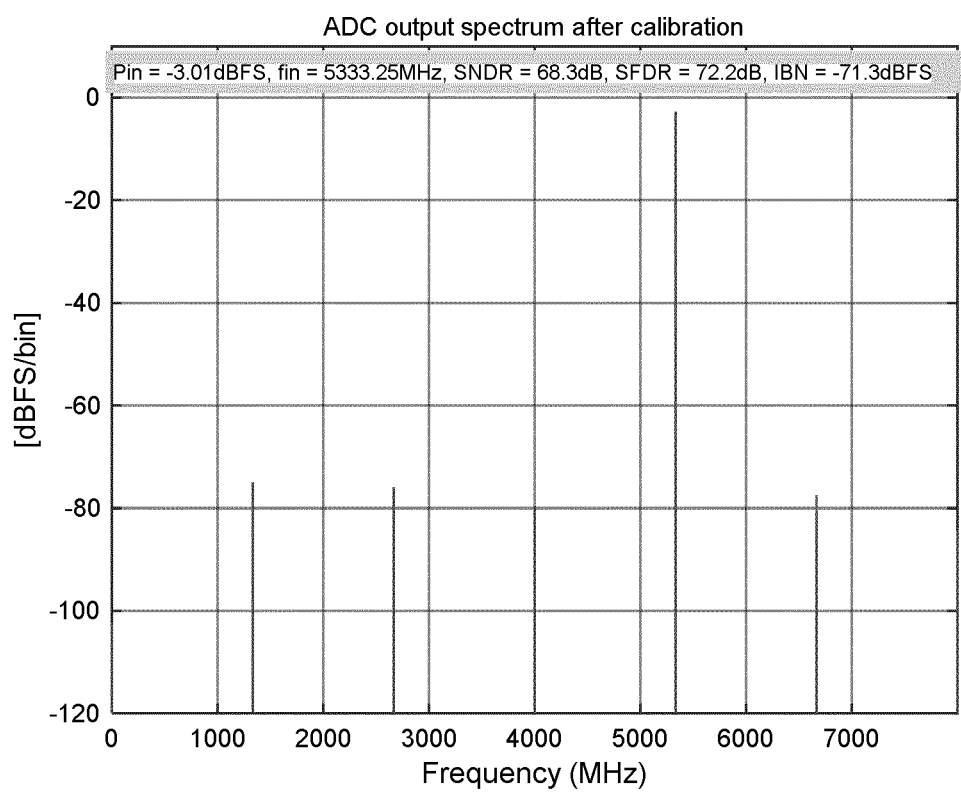
FIG. 14 illustrates a simulated TI-ADC output spectrum after calibration according to a second timing calibration technique.

Finally, the above simulation was repeated with a simplified timing error detection, based on using only the zero crossing; see FIG. 14, which shows the ADC output spectrum after calibration according to this simplified approach.

As shown above, an arrangement with a low-resolution ADC with 2 bits operating at full sample rate can be used as a reference to calibrate a higher-resolution time-interleaved ADC. Operating at full rate avoids disturbances caused by sub-sampling reference ADCs. A 2-bit ADC is sufficient to correct offset, gain and timing mismatches in the time-interleaved ADC. A 2-bit ADC will provide a low power overhead so that the technique can operate continuously in the background on regular signals, and simple calculations are sufficient to estimate the errors in the time-interleaved ADC so they can be corrected.

Figure 15:
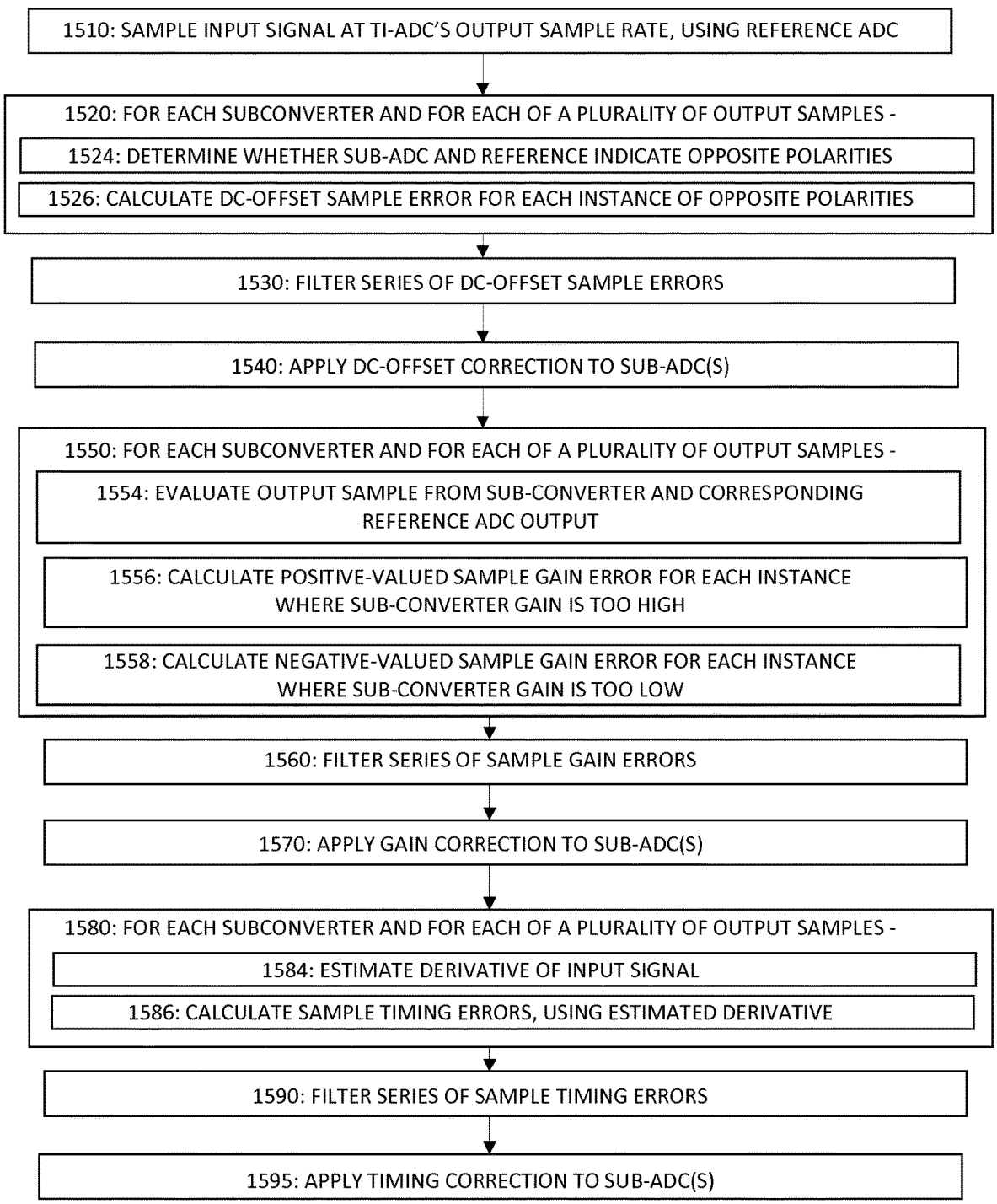
FIG. 15 is a process flow diagram showing an example method for calibrating a TI-ADC, according to some embodiments.

In view of the detailed examples and explanation provided above, it will be appreciated that FIG. 15 illustrates a generalized method for calibrating a time-interleaving analog-to-digital converter (TI-ADC) having a plurality of multi-bit sub-converters, according to some embodiments of the presently disclosed techniques, where each sub-converter samples an input signal at a sub-converter sampling rate that is a fraction of the TI-ADC's output sample rate, but at substantially uniform time offsets from others of the sub-converters, such that the output of the TI-ADC is a time-ordered series of the sub-converters' output samples.

As shown at block 1510, the illustrated method includes sampling the input signal at the TI-ADCs output sample rate, using a reference analog-to-digital converter (reference ADC) operating in parallel with the sub-converters. As shown at block 1520, the method further includes, for each sub-converter and for each of a plurality of output samples from the sub-converter, determining whether the output sample from the sub-converter indicates that the signal is on opposite sides of (i.e., has a different polarity with respect to) a reference level from the corresponding output from the reference ADC. In other words, the method comprises determining whether the output sample from the sub-converter indicates a polarity for the input signal, with respect to a reference level for the sub-converter output, that is opposite to the polarity indicated by the corresponding output from the reference ADC. This is shown at sub-block 1524. As shown at sub-block 1526, for each instance where the output sample from the sub-converter indicates that the input signal polarity is opposite that indicated by the corresponding output from the reference ADC, a DC-offset sample is calculated based on a difference between the output sample from the sub-converter and the reference level for the sub-converter output. In some embodiments, as discussed in the detailed examples above, the DC-offset sample is calculated as the difference between the output sample and the reference level; more generally, it may be calculated to be proportional to this difference. Alternatively, as also suggested by the detailed examples above, the DC-offset sample may be set to 1 for each instance where the output sample from the sub-converter is greater than the reference level for the sub-converter and set to −1 for each instance where the output sample from the sub-converter is less than the reference level for the sub-converter As shown at block 1530, for each sub-converter, a series of DC-offset samples calculated as above is filtered, to produce a DC-offset estimate for each sub-converter. This filtering may comprise a simple average, for example, or a moving average, a decaying filter, etc. Finally, as shown at block 1540, a DC-offset correction is applied for each of one or more of the sub-converters, based on the respective DC-offset estimate.

In some embodiments, applying the DC-offset correction for each of one or more of the sub-converters comprises correcting the respective DC-offset in the digital domain, by adding or subtracting an offset, based on the respective DC-offset estimate, to output samples of the respective sub-converter. In other embodiments, applying the DC-offset correction for each of one or more of the sub-converters comprises correcting the respective DC-offset in the analog domain, by adjusting a reference voltage or reference current in the respective sub-converter.

The steps shown in blocks 1510-1540 provide a DC-offset calibration for the sub-ADCs. In some embodiments, this process can be followed by or accompanied by a gain calibration, as shown at blocks 1550-1570. It will be appreciated that the process shown in blocks 1550-1570 may be carried out independently of the process shown in blocks 1520-1540, in some embodiments, and in some embodiments may be carried out before the process shown in blocks 1520-1540.

As shown at block 1550, the method further includes, for each sub-converter and for each of a plurality of output samples from the sub-converter, evaluating the output sample from the sub-converter with respect to the corresponding output from the reference ADC. This evaluating step is shown at sub-block 1554. As shown at sub-block 1556, for each instance where the output sample from the sub-converter indicates an input signal magnitude greater than the magnitude of a non-zero reference value when the corresponding output from the reference ADC indicates an input signal magnitude less than the magnitude of the non-zero reference value, a positive-valued sample gain error is calculated based on a difference between the output sample from the sub-converter and an expected output sample value for the non-zero reference value. These positive-valued sample gain errors indicate that the gain for the respective sub-ADC is too high. Likewise, as shown at sub-block 1558, for each instance where the output sample from the sub-converter indicates an input signal magnitude less than a non-zero reference value magnitude when the corresponding output from the reference ADC indicates an input signal magnitude greater than the non-zero reference value magnitude, a negative-valued sample gain error is calculated based on a difference between an expected output sample value for the non-zero reference value and the output sample from the sub-converter. These negative-valued sample gain errors indicate that the gain for the respective sub-ADC is too low.

In some embodiments, the positive-valued sample-gain error is calculated as equal to or proportional to the difference between the output sample from the sub-converter and the expected output sample value for the non-zero reference value. Likewise, the negative-valued sample-gain error may be calculated as equal to or proportional to the difference between the expected output sample value for the non-zero reference value and the output sample from the sub-converter. In other embodiments, each positive-valued sample gain error is simply set to 1 (or some other positive value) and each negative-valued sample gain error is set to −1 (or some other negative value).

As shown at block 1560, the method further includes filtering a series of sample gain errors as calculated above, for each sub-converter, to produce an average gain error for the respective sub-converter. In some embodiments, e.g., in some embodiments where the positive-valued and negative-valued sample gain errors are set to 1 and −1, respectively, the sample gain errors may be filtered along with zeros for each sample time where the evaluation of the output sample from the respective sub-converter did not result in the generation of a positive-valued or negative-valued sample gain error.

As shown at block 1570, a gain correction is then applied for each of one or more of the sub-converters, based on the respective average gain error. Applying the gain correction for each of one or more of the sub-converters may comprise correcting the respective average gain error in the analog domain, in some embodiments, by adjusting a reference voltage or reference current in the respective sub-converter. In other embodiments, applying the gain correction for each of one or more of the sub-converters may instead comprise correcting the respective average gain error in the digital domain, by applying a scaling factor, based on the respective average gain error, to output samples of the respective sub-converter.

The DC-offset and/or gain calibration techniques described above may be followed by and or accompanied by a timing offset calibration process, as shown at blocks 1580-1595. While the timing offset calibration procedure in FIG. 15 is illustrated after the DC-offset and gain calibration procedures, these may be performed in any order.

In some of these embodiments, as shown at block 1580, the method further includes, for each sub-converter and for each of a plurality of output samples from the sub-converter, estimating a derivative of the input signal at a point corresponding to the output sample, using neighboring output samples from sub-converters sampling before and after the sub-converter. This estimating is shown at sub-block 1584. As shown at sub-block 1586, the method further includes calculating sample timing errors for the subconverter, based on the sign of the estimated derivative and a DC-offset sample for the sub-converter and output sample.

In some embodiments, estimating the derivative of the input signal means simply estimating the sign of the derivative. In these embodiments, calculating the sample timing error may comprise multiplying the estimated sign of the derivative by the same DC-offset sample for the sub-converter and output sample used for the DC-offset calibration, or by any similarly obtained DC-offset sample, whether obtained using a zero-crossing comparator or with respect to some other reference level. In some embodiments, estimating the derivative of the input signal may include estimating a magnitude of the derivative, along with its sign. In some of these embodiments, the sample timing error may be calculated to be inversely proportional to the estimated derivative of the input signal, e.g., by dividing the DC-offset sample by the estimated derivate, for at least a range of magnitudes for the estimated derivatives.

As shown at block 1590, the method further includes, for each sub-converter, filtering a series of sample timing errors, to produce an average timing error for each sub-converter. A timing correction is then applied to each of one or more of the sub-converters, based on the respective average timing error, as shown at block 1595.

In some embodiments, estimating the derivative of the input signal comprises estimating only the sign of the derivative. In some embodiments, by contrast, calculating the sample timing errors further comprises scaling the sample timing errors inversely proportional to the estimated derivative of the input signal, for at least a range of estimated derivatives.

In some embodiments, applying the timing correction to each of one or more of the sub-converters comprises adjusting the sampling time of the respective sub-converter. In other embodiments, applying the timing correction to each of one or more of the sub-converters comprises applying the timing correction in the digital domain, by modifying output samples of the respective sub-converter based on the average timing error and based on estimative derivatives corresponding to the output samples to be modified.

While FIG. 15 illustrates some embodiments of example methods according to the presently disclosed techniques, FIG. 2, which was briefly discussed above, illustrates an example self-calibrating analog-to-digital converter (ADC) circuit that may be configured, according to various embodiments, to carry out any one or more of these techniques. The circuit of FIG. 2 includes a time-interleaving analog-to-digital converter (TI-ADC) 210 having a plurality of multi-bit sub-converters, each sub-converter being configured to sample an input signal at a sub-converter sampling rate that is a fraction of the TI-ADC's output sample rate. The sampling instants may be at substantially uniform time offsets from others of the sub-converters, such that the output of the TI-ADC is a time-ordered series of the sub-converters' output samples. The circuit further includes a reference analog-to-digital converter (reference ADC) 220 configured to sample the input signal in parallel with the sub-converters, at the TI-ADC's output sample rate, and a calibration circuit 230 (illustrated as a "digital calibration engine") configured to receive the output of the reference ADC and output samples from each of the sub-converters.

In various embodiments, calibration circuit 230 is configured to carry out one or more of the calibration processes described above, e.g., as illustrated in FIG. 15. Thus, for example, in some embodiments calibration circuit 230 is configured to, for each sub-converter and for each of a plurality of output samples from the sub-converter, determine whether the output sample from the sub-converter indicates an input signal polarity, with respect to a reference level for the sub-converter output, that is opposite that indicated by the corresponding output from the reference ADC and, for each instance where the output sample from the sub-converter indicates an input signal polarity opposite that indicated by the corresponding output from the reference ADC, calculate a DC-offset sample based on a difference between the output sample from the sub-converter and a target reference level value for the sub-converter output, e.g., using any of the detailed techniques for calculating the DC-offset sample discussed above. Calibration circuit 230 is further configured to filter a series of DC-offset samples for each sub-converter, to produce a DC-offset estimate for each sub-converter, and to apply a DC-offset correction for each of one or more of the sub-converters, based on the respective DC-offset estimate.

In some embodiments, the calibration circuit 230 is configured to apply the DC-offset correction for each of one or more of the sub-converters by adding or subtracting an offset, based on the respective DC-offset estimate, to output samples of the respective sub-converter. In others, calibration circuit 230 is configured to apply the DC-offset correction for each of one or more of the sub-converters by adjusting a reference voltage or reference current in the respective sub-converter.

In some embodiments, calibration circuit 230 may be instead or further configured to: for each sub-converter and for each of a plurality of output samples from the sub-converter, evaluate the output sample from the sub-converter with respect to the corresponding output from the reference ADC and, for each instance where the output sample from the sub-converter indicates an input signal magnitude greater than the magnitude of a non-zero reference value when the corresponding output from the reference ADC indicates an input signal magnitude less than the magnitude of the non-zero reference value, calculate a positive-valued sample gain error based on a difference between the output sample from the sub-converter and an expected output sample value for the non-zero reference value, and for each instance where the output sample from the sub-converter indicates an input signal magnitude less than a non-zero reference value magnitude when the corresponding output from the reference ADC indicates an input signal magnitude greater than the non-zero reference value magnitude, calculate a negative-valued sample gain error based on a difference between an expected output sample value for the non-zero reference value and the output sample from the sub-converter. The calculation of the positive-valued and negative-valued sample gain errors may be performed according to any of the detailed techniques described above, in various embodiments.

The calibration circuit 230 in these embodiments that performs gain calibration is further configured to filter a series of sample gain errors for each sub-converter, to produce an average gain error for each sub-converter, and to apply a gain correction for each of one or more of the sub-converters, based on the respective average gain error. In some of these embodiments, the calibration circuit 230 is configured to apply the gain correction for each of one or more of the sub-converters by adjusting a reference voltage or reference current in the respective sub-converter. In others, the calibration circuit 230 may be configured to apply the gain correction for each of one or more of the sub-converters by applying a scaling factor, based on the respective average gain error, to output samples of the respective sub-converter.

In some embodiments, the calibration circuit 230 is instead or is still further configured to: for each sub-converter and for each of a plurality of output samples from the sub-converter, estimate a derivative of the input signal at a point corresponding to the output sample, using neighboring output samples from sub-converters sampling before and after the sub-converter, and calculate sample timing errors for the subconverter, based on the estimated derivative and a DC-offset sample for the sub-converter and output sample. Once more, the calculation of the sample timing errors may be according to any of the techniques described above, in various embodiments.

In these embodiments in which timing offset calibration is performed, calibration circuit 230 is further configured to filter a series of sample timing errors for each sub-converter, to produce an average timing error for each sub-converter, and to apply a timing correction for each of one or more of the sub-converters, based on the respective average timing error. In some embodiments, the calibration circuit 230 is configured to estimate only the sign of the derivative, while in others, the calibration circuit 230 is configured to scale the sample timing errors inversely proportional to the estimated derivative of the input signal, for at least a range of estimated derivatives. In some embodiments, calibration circuit 230 is configured to apply the timing correction for each of one or more of the sub-converters by adjusting the sampling time of the respective sub-converter; in others, calibration circuit 230 is configured to apply the timing correction to each of one or more of the sub-converters by modifying output samples of the respective sub-converter based on the average timing error and based on estimative derivatives corresponding to the output samples to be adjusted.

The invention claimed is:

1. A method for calibrating a time-interleaving analog-to-digital converter (TI-ADC) having a plurality of multi-bit sub-converters, each of the plurality of sub-converters sampling an input signal at a sub-converter sampling rate that is a fraction of an output sample rate for the TI-ADC, the method comprising:
   sampling the input signal at the TI-ADCs output sample rate, using a reference analog-to-digital converter (reference ADC) operating in parallel with the sub-converters;
   for each sub-converter and for each of a plurality of output samples from the sub-converter, determining whether the output sample from the sub-converter indicates an input signal polarity, with respect to a corresponding reference level for the sub-converter output, opposite that indicated by the corresponding output from the reference ADC and, for each instance where the output sample from the sub-converter indicates that the input signal polarity is opposite that indicated by the corresponding output from the reference ADC, calculating a DC-offset sample based on a difference between the output sample from the sub-converter and the reference level;
   filtering a series of DC-offset samples for each sub-converter, to produce a DC-offset estimate for each sub-converter; and
   applying a DC-offset correction for each of one or more of the sub-converters, based on the respective DC-offset estimate.

2. The method of claim 1, wherein calculating the DC-offset sample comprises calculating the DC-offset sample as proportional to the difference between the output sample from the sub-converter and the reference level.

3. The method of claim 1, wherein calculating the DC-offset sample comprises setting the DC-offset sample to +1 for each instance where the output sample from the sub-converter is greater than the reference level for the sub-converter and setting the DC-offset sample to −1 for each instance where the output sample from the sub-converter is less than the reference level for the sub-converter.

4. The method of claim 1, wherein applying the DC-offset correction for each of one or more of the sub-converters comprises either:
   correcting the respective DC-offset in the digital domain, by adding or subtracting an offset, based on the respective DC-offset estimate, to output samples of the respective sub-converter, or
   correcting the respective DC-offset in the analog domain, by adjusting a reference voltage or reference current in the respective sub-converter.

5. The method of claim 1, further comprising:
   for each sub-converter and for each of a plurality of output samples from the sub-converter, evaluating the output sample from the sub-converter with respect to the corresponding output from the reference ADC and,
      for each instance where the output sample from the sub-converter indicates an input signal magnitude greater than the magnitude of a non-zero reference value when the corresponding output from the reference ADC indicates an having a plurality of multi-bit sub-converters, each of the plurality of sub-converters sampling an input signal at a sub-converter sampling rate that is a fraction of an output sample rate of the TI-ADC, the method comprising:
   sampling the input signal at the TI-ADCs output sample rate, using a reference analog-to-digital converter (reference ADC) operating in parallel with the sub-converters;
   for each sub-converter and for each of a plurality of output samples from the sub-converter,
      estimating a derivative of the input signal at a point corresponding to the output sample, using neighboring output samples from sub-converters sampling before and after the sub-converter, and
      calculating a sample timing error for the sub-converter, based on the estimated derivative and a DC-offset sample for the sub-converter and output sample;
   filtering a series of sample timing errors for each sub-converter, to produce an average timing error for each sub-converter; and
   applying a timing correction to each of one or more of the sub-converters, based on the respective average timing error.

6. The method of claim 5, wherein calculating each positive-valued sample gain error comprises calculating the positive-valued sample-gain error as proportional to the difference between the output sample from the sub-converter and the expected output sample value for the non-zero reference value magnitude, and wherein calculating each negative-valued sample gain error comprises calculating the negative-valued sample-gain error as proportional to the difference between the expected output sample value for the non-zero reference value magnitude and the output sample from the sub-converter.

7. The method of claim 5, wherein calculating each positive-valued sample gain error comprises setting the positive-valued sample-gain error to +1 and wherein calculating each negative-valued sample gain error comprises setting the negative-valued sample-gain error to −1.

8. The method of claim 5, wherein applying the gain correction for each of one or more of the sub-converters comprises either:
   correcting the respective average gain error in the analog domain, by adjusting a reference voltage or reference current in the respective sub-converter; or correcting the respective average gain error in the digital domain, by applying a scaling factor, based on the respective average gain error, to output samples of the respective sub-converter.

9. The method of claim 1, wherein the method further comprises:
for each sub-converter and for each of a plurality of output samples from the sub-converter,
estimating a derivative of the input signal at a point corresponding to the output sample, using neighboring output samples from sub-converters sampling before and after the sub-converter, and
calculating a sample timing error for the sub-converter, based on the estimated derivative and the DC-offset sample for the sub-converter and output sample;
filtering a series of sample timing errors for each sub-converter, to produce an average timing error for each sub-converter; and
applying a timing correction to each of one or more of the sub-converters, based on the respective average timing error.

10. The method of claim 9, wherein said estimating the derivative of the input signal comprises estimating only the sign of the derivative, and wherein calculating the sample timing error comprises multiplying the estimated sign of the derivative by the DC-offset sample for the sub-converter and output sample.

11. The method of claim 9, wherein calculating the sample timing error comprises calculating the sample timing error to be inversely proportional to the estimated derivative of the input signal, for at least a range of magnitudes for the estimated derivatives.

12. The method of claim 9, wherein applying the timing correction to each of one or more of the sub-converters comprises either:
adjusting the sampling time of the respective sub-converter; or
applying the timing correction in the digital domain, by modifying output samples of the respective sub-converter based on the average timing error and based on estimative derivatives corresponding to the output samples to be modified.

13. The method of claim 1, the method further comprising:
for each of the sub-converters, filtering magnitudes for a series of DC-offset samples obtained for the sub-converter subsequently to said applying the DC-offset correction to the sub-converter, to produce a sample timing error magnitude; and
applying a timing correction to each of one or more of the sub-converters, based on the respective sample timing error magnitude.

14. The method of claim 13, wherein the method comprises repeating said filtering of magnitudes, for subsequent series of DC-offset samples, and repeating said applying of the timing correction, using a trial-and-error approach, so as to reduce the sample timing error magnitude.

15. A self-calibrating analog-to-digital converter (ADC) circuit, comprising:
a time-interleaving analog-to-digital converter (TI-ADC) having a plurality of multi-bit sub-converters, each of the plurality of sub-converters being configured to sample an input signal at a sub-converter sampling rate that is a fraction of an output sample rate of the TI-ADC;
a reference analog-to-digital converter (reference ADC) configured to sample the input signal in parallel with the sub-converters, at the TI-ADC's output sample rate;
and a calibration circuit configured to receive the output of the reference ADC and output samples from each of the sub-converters, the calibration circuit being further configured to,
for each sub-converter and for each of a plurality of output samples from the sub-converter, determine whether the output sample from the sub-converter indicates an input signal polarity, with respect to a corresponding reference level for the sub-converter output, opposite that indicated by the corresponding output from the reference ADC and, for each instance where the output sample from the sub-converter indicates that the input signal polarity is opposite that indicated by the corresponding output from the reference ADC, calculate a DC-offset sample based on a difference between the output sample from the sub-converter and the reference level,
filter a series of DC-offset samples for each sub-converter, to produce a DC-offset estimate for each sub-converter, and
apply a DC-offset correction for each of one or more of the sub-converters, based on the respective DC-offset estimate.

16. The self-calibrating ADC circuit of claim 15, wherein the calibration circuit is configured to calculate the DC-offset sample as proportional to the difference between the output sample from the sub-converter and the reference level.

17. The self-calibrating ADC circuit of claim 15, wherein the calibration circuit is configured to calculate the DC-offset sample by setting the DC-offset sample to +1 for each instance where the output sample from the sub-converter is greater than the reference level for the sub-converter and setting the DC-offset sample to −1 for each instance where the output sample from the sub-converter is less than the reference level for the sub-converter.

18. The self-calibrating ADC circuit of claim 15, wherein the calibration circuit is further configured to:
for each sub-converter and for each of a plurality of output samples from the sub-converter, evaluate the output sample from the sub-converter with respect to the corresponding output from the reference ADC and,
for each instance where the output sample from the sub-converter indicates an input signal magnitude greater than the magnitude of a non-zero reference value when the corresponding output from the reference ADC indicates an input signal magnitude less than the magnitude of the non-zero reference value, calculate a positive-valued sample gain error based on a difference between the output sample from the sub-converter and an expected output sample value for the non-zero reference value magnitude, and
for each instance where the output sample from the sub-converter indicates an input signal magnitude less than a non-zero reference value magnitude when the corresponding output from the reference ADC indicates an input signal magnitude greater than the non-zero reference value magnitude, calculate a negative-valued sample gain error based on a difference between an expected output sample value for the non-zero reference value magnitude and the output sample from the sub-converter;

filter a series of sample gain errors for each sub-converter, to produce an average gain error for each sub-converter; and apply a gain correction for each of one or more of the sub-converters, based on the respective average gain error.

19. The self-calibrating ADC circuit of claim 15, wherein the calibration circuit is further configured to:

for each of the sub-converters, filter magnitudes for a series of DC-offset samples obtained for the sub-converter subsequently to said applying the DC-offset correction to the sub-converter, to produce a sample timing error magnitude; and apply a timing correction to each of one or more of the sub-converters, based on the respective sample timing error magnitude.

20. The self-calibrating ADC circuit of claim 19, wherein the calibration circuit is configured to repeat said filtering of magnitudes, for subsequent series of DC-offset samples, and to repeat said applying of the timing correction, using a trial-and-error approach, so as to reduce the sample timing error magnitude.

21. A method for calibrating a time-interleaving analog-to-digital converter (TI-ADC) having a plurality of multi-bit sub-converters, each of the plurality of sub-converters sampling an input signal at a sub-converter sampling rate that is a fraction of an output sample rate of the TI-ADC, the method comprising:

sampling the input signal at the TI-ADCs output sample rate, using a reference analog-to-digital converter (reference ADC) operating in parallel with the sub-converters;

for each sub-converter and for each of a plurality of output samples from the sub-converter, evaluating the output sample from the sub-converter with respect to the corresponding output from the reference ADC and, for each instance where the output sample from the sub-converter indicates an input signal magnitude greater than the magnitude of a non-zero reference value when the corresponding output from the reference ADC indicates an input signal magnitude less than the magnitude of the non-zero reference value, calculating a positive-valued sample gain error based on a difference between the output sample from the sub-converter and an expected output sample value for the non-zero reference value magnitude, and for each instance where the output sample from the sub-converter indicates an input signal magnitude less than a non-zero reference value magnitude when the corresponding output from the reference ADC indicates an input signal magnitude greater than the non-zero reference value magnitude, calculating a negative-valued sample gain error based on a difference between an expected output sample value for the non-zero reference value magnitude and the output sample from the sub-converter;

filtering a series of sample gain errors for each sub-converter, to produce an average gain error for each sub-converter; and applying a gain correction for each of one or more of the sub-converters, based on the respective average gain error.

22. The method of claim 21, wherein calculating each positive-valued sample gain error comprises calculating the positive-valued sample-gain error as proportional to the difference between the output sample from the sub-converter and the expected output sample value for the non-zero reference value magnitude, and wherein calculating each negative-valued sample gain error comprises calculating the negative-valued sample-gain error as proportional to the difference between the expected output sample value for the non-zero reference value magnitude and the output sample from the sub-converter.

23. The method of claim 21, wherein calculating each positive-valued sample gain error comprises setting the positive-valued sample-gain error to 1 and wherein calculating each negative-valued sample gain error comprises setting the negative-valued sample-gain error to −1.

24. A method for calibrating a time-interleaving analog-to-digital converter (TI-ADC) calculating the sample timing error to be inversely proportional to the estimated derivative of the input signal, for at least a range of magnitudes for the estimated derivatives.

25. The method of claim 24, wherein said estimating the derivative of the input signal comprises estimating only the sign of the derivative, and wherein calculating the sample timing error comprises multiplying the estimated sign of the derivative by the DC-offset sample for the sub-converter and output sample.

26. The method of claim 24, wherein calculating the sample timing error comprises input signal magnitude less than the magnitude of the non-zero reference value, calculating a positive-valued sample gain error based on a difference between the output sample from the sub-converter and an expected output sample value for the non-zero reference value magnitude, and for each instance where the output sample from the sub-converter indicates an input signal magnitude less than a non-zero reference value magnitude when the corresponding output from the reference ADC indicates an input signal magnitude greater than the non-zero reference value magnitude, calculating a negative-valued sample gain error based on a difference between the expected output sample value for the non-zero reference value magnitude and the output sample from the sub-converter;

filtering a series of sample gain errors for each sub-converter, to produce an average gain error for each sub-converter; and applying a gain correction for each of one or more of the sub-converters, based on the respective average gain error.

* * * * *